US007014955B2

(12) United States Patent
Chang et al.

(10) Patent No.: US 7,014,955 B2
(45) Date of Patent: Mar. 21, 2006

(54) SYSTEM AND METHOD FOR INDENTIFYING DUMMY FEATURES ON A MASK LAYER

(75) Inventors: Fang-Cheng Chang, Sunnyvale, CA (US); Christophe Pierrat, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 882 days.

(21) Appl. No.: 09/941,453

(22) Filed: Aug. 28, 2001

(65) Prior Publication Data

US 2003/0044059 A1    Mar. 6, 2003

(51) Int. Cl.
G03F 9/00        (2006.01)
G06K 9/00        (2006.01)
(52) U.S. Cl. .......................... 430/5; 430/30; 382/144; 382/149; 716/19; 716/20; 716/21
(58) Field of Classification Search ................ 430/5, 430/30; 382/144, 149; 716/19, 20, 21
See application file for complete search history.

(56) References Cited

U.S. PATENT DOCUMENTS

| | | | |
|---|---|---|---|
| 5,326,659 A | 7/1994 | Liu et al. ........................ 430/5 |
| 5,340,700 A | 8/1994 | Chen et al. .................. 430/312 |
| 5,432,714 A | 7/1995 | Chung et al. ................ 364/525 |
| 5,572,598 A | 11/1996 | Wihl et al. .................. 382/144 |
| 5,597,668 A | 1/1997 | Nowak et al. |
| 5,795,688 A | 8/1998 | Burdorf et al. ............... 430/30 |
| 5,801,954 A | 9/1998 | Le et al. ..................... 364/488 |
| 5,804,340 A | 9/1998 | Garza et al. .................... 430/5 |
| 5,815,685 A | 9/1998 | Kamon ........................ 395/500 |
| 5,825,647 A | 10/1998 | Tsudaka ................ 364/167.03 |
| 5,849,440 A | 12/1998 | Lucase et al. .................. 430/5 |
| 5,862,058 A | 1/1999 | Samuels et al. ............ 364/491 |
| 5,900,338 A | 5/1999 | Garza et al. .................... 430/5 |
| 6,009,250 A | 12/1999 | Ho et al. ................ 395/500.06 |
| 6,009,251 A | 12/1999 | Ho et al. ................ 395/500.06 |
| 6,011,911 A | 1/2000 | Ho et al. ................ 395/500.06 |
| 6,016,357 A | 1/2000 | Neary et al. ................ 382/144 |
| 6,023,328 A | 2/2000 | Pierrat ..................... 356/237.4 |
| 6,076,465 A | 6/2000 | Vacca et al. ................ 101/481 |
| 6,078,738 A | 6/2000 | Garza et al. ........... 395/500.22 |
| 6,081,659 A | 6/2000 | Garza et al. ........... 395/500.22 |
| 6,091,845 A | 7/2000 | Pierrat et al. ............... 382/144 |
| 6,130,750 A | 10/2000 | Ausschnitt et al. ......... 356/401 |
| 6,171,731 B1 | 1/2001 | Medvedeva et al. ........... 430/5 |
| 6,272,236 B1 | 8/2001 | Pierrat et al. ............... 382/144 |
| 6,334,209 B1 | 12/2001 | Hashimoto et al. ........... 716/21 |
| 6,346,426 B1 | 2/2002 | Toprac et al. .................. 438/8 |
| 6,656,648 B1 * | 12/2003 | Inoue .......................... 430/30 |
| 6,846,597 B1 * | 1/2005 | Narukawa et al. ............. 430/5 |

| | | | |
|---|---|---|---|
| 2001/0004122 A1 | 6/2001 | Ito |
| 2001/0005619 A1 | 6/2001 | Hasebe et al. |
| 2002/0019729 A1 | 2/2002 | Chang et al. .................. 703/6 |
| 2002/0164064 A1 | 11/2002 | Karklin et al. .............. 382/145 |
| 2002/0164065 A1 | 11/2002 | Cai et al. ..................... 382/149 |

FOREIGN PATENT DOCUMENTS

| | | |
|---|---|---|
| WO | WO 97/13370 | 4/1997 |
| WO | WO 98/20327 | 5/1998 |
| WO | WO 98/45685 | 10/1998 |
| WO | WO 99/14706 A2 | 3/1999 |
| WO | WO 99/14706 A3 | 3/1999 |
| WO | WO 99/38002 | 7/1999 |
| WO | WO 99/56113 | 11/1999 |
| WO | WO 99/59200 | 11/1999 |
| WO | WO 99/67626 | 12/1999 |
| WO | WO 00/36525 A2 | 6/2000 |
| WO | WO 00/67074 A1 | 11/2000 |
| WO | WO 00/67075 A1 | 11/2000 |
| WO | WO 00/67076 A1 | 11/2000 |

OTHER PUBLICATIONS

Watanabe, H., et al., "Detection and Printability of Shifter Defects in Phase-Shifting Masks", Japanese Journal of Applied Physics, vol. 30, No. 11B, pp. 3016-3020, Nov. 1991.

Hosono, K., et al., "A Novel Architecture for High Speed Dual Image Generation of Pattern Data for Phase Shifting Reticle Inspection", SPIE—Integrated Circuit Metrology, Inspection, and Process Control VI, vol. 1673, pp. 229-235 (1992).

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Reynolds, J., "Elusive Mask Defects: Reflectivity Variations", Solid State Technology, pp. 75-76, Mar. 1995.

Kusunose, H., et al., "Direct Phase-Shift Measurement with Transmitted Deep-UV Illumination", SPIE, vol. 2793, pp. 251-260 (1996).

Tejnil, E., et al., "Option for At-Wavelength Inspection of Patterned Extreme Ultraviolet Lithography Masks", SPIE Bacus '99, pp. 1-12 (1999).

(Continued)

Primary Examiner—Christopher G. Young
(74) Attorney, Agent, or Firm—Bever, Hoffman & Harms, LLP; Jeanette S. Harms

(57) ABSTRACT

Automated techniques for identifying dummy/main features on a mask layer are provided. In a multiple mask layer technique, the definition of a dummy/main feature can be based on connectivity information or functional association information. In a geometry technique, the definition of a dummy/main feature can be based on a feature size, a feature shape, a pattern of features, or a proximity of a feature to a neighboring feature. In one embodiment, multiple definitions and multiple techniques can be used.

19 Claims, 9 Drawing Sheets

OTHER PUBLICATIONS

Hemar, S., et al., "Finding Killer CD Variations by Full-Reticle CD Mapping", Microlithography World, pp. 4, 6, 8 & 10 (Summer 2000).

Casey, Jr., J.D., et al., "Chemically Enhanced FIB Repair of Opaque Defects on Molybdenum Silicide Photomasks", SPIE, vol. 3236, pp. 487-497 (1997).

Mathur, B.P., et al., "Quantitative Evaluation of Shape of Image on Photoresist of Square Apertures", IEEE, Transactions On Electron Devices, vol. 35, No. 3, pp. 294-297, Mar. 1988.

Neureuther, A., "Modeling Phase Shifting Masks", SPIE, 10th Annual Symposium On Microlithography, vol. 1496, pp. 80-85 (1990).

Henke, W., et al., "A Study of Reticle Defects Imaged Into Three-Dimensional Developed Profiles of Positive Photoresist Using the Solid Lithography Simulator", Microelectronics Eng., vol. 14, pp. 283-297 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Ham, Y.M., et al., "Dependence of Defects in Optical Lithography", Jpn. J. Appl. Phys., vol. 31, pp. 4137-4142 (1992).

Ohtsuka, H., et al., "Phase Defect Repair Method for Alternating Phase Shift Masks Conjugate Twin-Shifter Method", Jpn. J. Appl. Phys., vol. 31, pp. 4143-4149 (1992).

Watanabe, H., et al., "Detection and Printability of Shifter Defects in Phase-Shifting Masks II Defocus Characteristics", Jpn. J. Appl. Phys., vol. 31, pp. 4155-4160 (1992).

Crisalle, O., et al., "A Comparison of the Optical Projection Lithography Simulators in Sample and Prolith", IEEE, Transactions On Semiconductor Manufacturing, vol. 5, No. 1, pp. 14-26, Feb. 1992.

Nistler, J., et al., "Phase Shift Mask Defect Printability Analysis", Proceedings Of The Microlithography Seminar INTERFACE '93, OCG Microelectronic Materials, Inc., pp. 11-28 (1993).

Wiley, J., et al., "Device Yield and Reliability by Specification of Mask Defects", Solid State Technology, vol. 36, No. 7, pp. 65-66, 70, 72, 74, 77, Jul. 1993.

Nistler, J., et al., "Large Area Optical Design Rule Checker for Logic PSM Application", SPIE, Photomask And X-Ray Mask Technology, vol. 2254, pp. 78-92 (1994).

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Spence, C., et al., "Automated Determination of CAD Layout Failures Through Focus: Experiment and Simulation", SPIE, vol. 2197, pp. 302-313 (1994).

Qian, Q.D., et al., "A New Scalar Planewave Model for High NA Lithography Simulations", IEEE, pp. 45-48 (1994).

Karklin, L., "A Comprehensive Simulation Study of the Photomask Defects Printability", SPIE, vol. 2621, pp. 490-504 (1995).

Wiley, J., et al., "The Effect of Off-Axis Illumination on the Printability of Opaque and Transparent Reticle Defects", SPIE, vol. 2512, pp. 432-440 (1995).

Brunner, T., et al., "Approximate Models for Resist Processing Effects", SPIE, vol. 2726, pp. 198-207, Mar. 1996.

Chang, K., et al., "Accurate Modeling of Deep Submicron Interconnect Technology", TMA Times, vol. IX, No. 3 (1997).

Gans, F., et al., "Printability and Repair Techniques for DUV Photomasks", SPIE, Proceedings Of The 17th Annual Symposium On Photomask Technology And Management, vol. 3236, pp. 136-141 (1997).

Ibsen, K., et al., "Clear Field Reticle Defect Diposition for Advanced Sub-Half Micron Lithography", SPIE, Proceedings Of The 17th Annual Symposium On Photomask Technology And Management, vol. 3236, pp. 124-135 (1997).

Pati, Y.C., et al., "Exploiting Structure in Fast Aerial Image Computation for Integrated Circuit Patterns", IEEE Transactions On Semiconductor Manufacturing, vol. 10, No. 1, pp. 62-74, Feb. 1997.

Vacca, A., et al., "100nm Defect Detection Using a Dynamically Programmable Image Processing Algorithm", SPIE, vol. 3236 (1997) (Abstract Only).

Kubota, H., et al., "A Fast Method of Simulating Resist Pattern Contours Based on Mean Inhibitor Concentration", Jpn. J. Appl. Phys., vol. 37, pp. 5815-5820 (1998).

Vacca, A., et al., "100nm Defect Detection Using an Existing Image Acquisition System", SPIE, vol. 3236, pp. 208-221 (1998).

Fukuda, H., et al., "Determination of High-Order Lens Aberration Using Phase/Amplitude Linear Algebra", J. Vac. Sci. Technol. B, vol. 17, No. 6, pp. 3318-3321, Nov./Dec. 1999.

Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295, Nov./Dec. 1999.

Balasinski, A., et al., "A Novel Approach to Simulate the Effect of Optical Proximity on MOSFET Parametric Yield", IEEE, pp. 37.6.1-37.6.4 (1999).

Balasinski, A., et al., "Comparison of Mask Writing Tools and Mask Simulations for 0.16um Devices", IEEE, SEMI Advanced Semiconductor Manufacturing Conference, pp. 372-377 (1999).

Lin, B.J., et al., "Single-Level Electric Testsites for Phase-Shifting Masks", SPIE, vol. 1673, pp. 221-228, Mar. 9-11, 1992.

* cited by examiner

SYSTEM AND METHOD FOR INDENTIFYING DUMMY FEATURES ON A MASK LAYER

BACKGROUND OF THE INVENTION

1. Field of the Invention

The invention relates to an automated system and method for distinguishing dummy features from main features on a mask layer, thereby effectively using resource and cycle time.

2. Description of the Related Art

A typical wafer for an integrated circuit (IC) includes multiple layers formed on a substrate. These layers, each layer having a predetermined pattern thereon, can result in an uneven topography on the wafer surface. An uneven topography on one layer can have adverse effects on one or more subsequent layers.

For example, FIG. 1A illustrates a cross-section of an etched layer 100 on a wafer, wherein etched layer 100 includes two features 101 and 102. Feature 101 extends above a level 103, i.e. a protrusion, whereas feature 102 extends below level 103, i.e. an intrusion. If another layer 104 is formed on etched layer 100, as shown in FIG. 1B, layer 104 can also have an uneven surface due to the uneven topography of layer 100. The uneven surface of layer 104 can undesirably complicate lithographic processing on this layer because of light reflection or inadequate coverage over the "steps" in layer 100.

A common technique used to counter the effects of an uneven topography is planarization. The goal of planarization is to ensure that subsequent lithographic results are independent from or, more realistically, much less dependent on the underlying wafer topography from previous layers. Planarization is especially important for layers requiring critical dimension control. Specifically, an uneven topography could pose significant depth of focus problems, thereby rendering CD control across the wafer virtually impossible.

However, planarization itself can cause problems on the wafer. For example, in one known planarization process shown in FIG. 1C, a thick spin-on-glass (SOG) layer 105 can be formed on etched layer 100. After formation, SOG layer 104 is baked, thereby leaving substantially planarized silicon dioxide. The resulting surface, although significantly more even than layer 104, still retains irregularities that can influence a subsequent lithographic process. For this reason, a chemo-mechanical polish (CMP) can be used to polish SOG layer 105.

In a CMP process, a device mechanically polishes the surface of the wafer. Unfortunately, because of the underlying features in layer 100, such as features 101 and 102, the polishing of layer 105 can result in an uneven force being applied to certain areas of the surface of the wafer. In turn, this uneven force can cause some mechanical stress or even bowing of the wafer, thereby resulting in uneven polishing of the surface. FIG. 1D illustrates a recessed area 106 that could result from a CMP of layer 105.

To prevent such recesses, dummy pillars can be placed on regions of the wafer where geometry density is low, thereby providing mechanical support during a CMP and thus preventing uneven polishing. For example, FIG. 2 illustrates a top-level view of a layer 200 including two main features 201 and 202 and dummy pillars 203 and 204. The process of introducing these dummy pillars (hereinafter dummy features) is often referred to as "dummification".

During the mask design process, dummy features 203–204 are added after the layout design of main features 201–202. Of importance, a GDS-II file for a mask layer can include multi-level information, thereby allowing main features 201–202 to be distinguishable from dummy features 203–204. However, this design information can then be mapped into a mask data preparation (MDP) language, which is a one-level file. In one embodiment, this mapping can be performed by the CATS™ tool, which is licensed by the assignee of the invention. Thus, after layout, dummy features 203–204 and main features 201–202 are effectively treated as one type of data. As a consequence, post-layout processing is applied globally to all features including the dummy features instead of selectively to only the main features. Examples of post-layout processes can include optical proximity correction (OPC), placement of phase shifting structures, mask writing, mask fabrication, mask inspection, and mask defect correction.

Applying such post-layout processes globally can result in wasted resources and cycle time. In some cases, unnecessary processing of dummy or other less important features can take up a significant portion or even the majority of the manufacturing cycle. Therefore, a need arises for a system and method of identifying features on a mask layer for post-layout processing.

SUMMARY OF THE INVENTION

In accordance with one feature of the invention, dummy features can be distinguished from main features using various automated techniques. These techniques can be advantageously applied to any post-layout mask process when dummy features are not separated from the main features in data representation. In general, a method of distinguishing a dummy feature from a main feature includes selecting a mask layer, providing a technique to identify the dummy feature on the mask layer, and applying the technique to the selected mask layer. The technique can be based on information from multiple mask layers or geometric information from the selected mask layer.

In a multiple mask layer technique, the information can include connectivity between the selected mask layer and the other mask layer(s). In one embodiment, this connectivity information can be provided by a contact or via layer. The information can also include a functional association between the selected mask layer and the other mask layer(s). For example, functional association information can be provided by a polysilicon layer and a diffusion layer.

In a geometric technique, the information can include determining a size or a shape of a feature, wherein the dummy/main feature can have a size greater than a predetermined size or can have a predetermined shape. In another case, dummy/main features can have a predetermined pattern, i.e. a certain shape and inter-feature spacing. In yet another case, a dummy/main feature can have a set proximity to another feature on the same layer.

In one embodiment, information from both the multiple mask layer technique and the geometric technique can be used to identify a dummy/main feature.

In accordance with another feature of the invention, an automated method of processing a mask layer for an integrated circuit is provided. The method includes identifying a plurality of main features and at least one dummy feature in the mask layer, then providing the processing only to the main features. The processing can include correcting for optical proximity, providing phase-shifting structures, mask fabrication, mask inspection, and correcting mask defects.

In one embodiment, at least one of the main features includes an assist bar, i.e. an optical proximity correction structure. In another embodiment, the dummy feature can provide mechanical support for an integrated circuit (IC) layer corresponding to the mask layer. For example, dummy features can be provided to protect the IC layer during a chemical mechanical polish (CMP) operation. In yet another embodiment, the dummy feature can improve the resolution of one or more main features on the mask layer as the features are transferred during a write operation onto the IC layer. For example, fake gates on a polysilicon mask layer can be used to improve the resolution of the gates on the IC layer. Thus, the fake gates can serve as printable optical proximity correction structures. In yet another embodiment, the dummy features can provide test patterns or identification markings for the IC layer.

In accordance with another feature of the invention, a system for processing a mask layer for an integrated circuit is provided. The system can include means for receiving information regarding a feature of the mask layer, means for determining the feature is one of a main feature and a dummy feature based on the information, and means for identifying the feature as appropriate for further processing if the feature is a main feature and as inappropriate for further processing if the feature is a dummy feature. In one embodiment, the system further includes means for receiving user input regarding the information.

In accordance with another feature of the invention, an integrated circuit is provided. The integrated circuit can include a plurality of main features and at least one dummy feature, wherein only the main features reflect post-fabrication processing. In one embodiment, the post-fabrication processing can include defect correction. Thus, unlike the prior art, the dummy features on the IC layer can include defects.

In accordance with another feature of the invention, a program storage device readable by a machine is provided. The program storage device tangibly embodies a program of instructions executable by the machine to perform method steps to analyze a mask layer for an integrated circuit. The method includes providing a technique to distinguish a main feature from a dummy feature in the mask layer and applying the technique to the mask layer. In one embodiment, the program storage device can further include means for receiving user input regarding the technique. The technique can include determining a feature size, a feature shape, a pattern from multiple features, or a proximity of a feature to another feature. The technique can also include using information from at least one other mask layer for the integrated circuit. This information can include connectivity between the mask layer and the other mask layer(s) or a functional association between the mask layer and the other mask layer(s).

In accordance with another feature of the invention, a computer program product is provided. The computer program includes a computer usable medium having a computer readable program code embodied therein for causing a computer to analyze a mask layer for an integrated circuit. The computer readable program code can include computer readable program code that receives information regarding a feature of the mask layer, computer readable program code that determines the feature is one of a main feature and a dummy feature based on the information, and computer readable program code that identifies the feature as appropriate for further processing if the feature is a main feature and as inappropriate for further processing if the feature is a dummy feature. In one embodiment, the computer readable program code can receive user input regarding the technique. The computer program product can further include computer readable program code that determines at least one of a feature size, a feature shape, a pattern from multiple features, and a proximity of the feature to another feature. The computer readable program code can also use information from at least one other mask layer for the integrated circuit. The information can include connectivity information between the mask layer and the other mask layer(s). Additionally, the information can include an association between the mask layer and the other mask layer(s).

DETAILED DESCRIPTION OF THE FIGURES

Figure 1A:
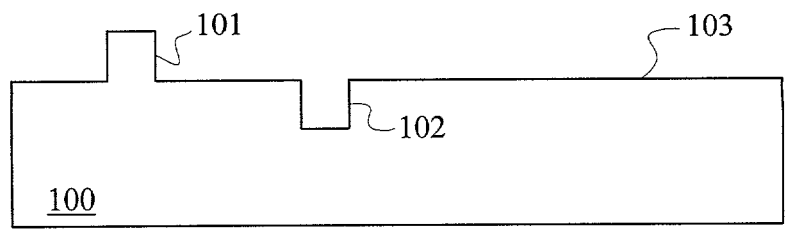
FIG. 1A illustrates a cross-section of an etched layer on a wafer, wherein the etched layer includes two features.
Figure 1B:
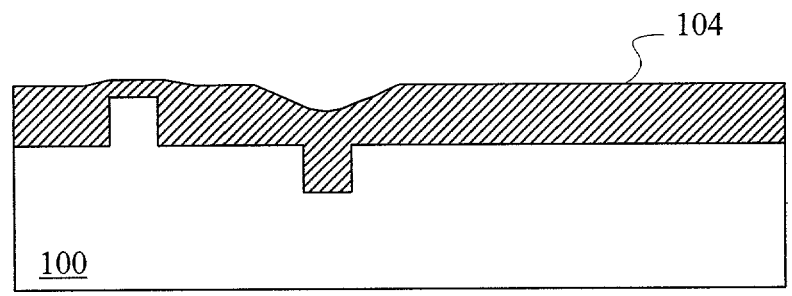
FIG. 1B illustrates a second layer formed on the etched layer of FIG. 1A, wherein the second layer can have an uneven surface due to the uneven topography of the underlying etched layer.
Figure 1C:
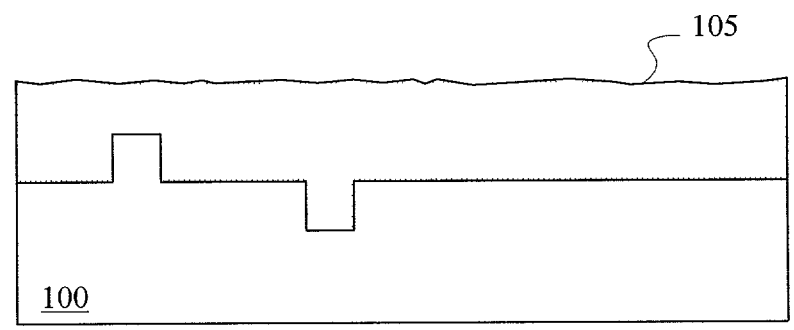
FIG. 1C illustrates a thick spin-on-glass (SOG) layer formed on the etched layer, wherein the SOG layer retains some surface irregularities.
Figure 1D:
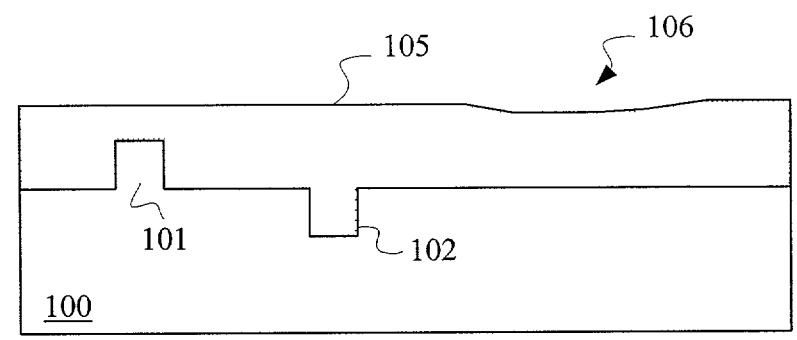
FIG. 1D illustrates a recessed area that could result from a chemo-mechanical polish of the SOG layer of FIG. 1C.
Figure 2:
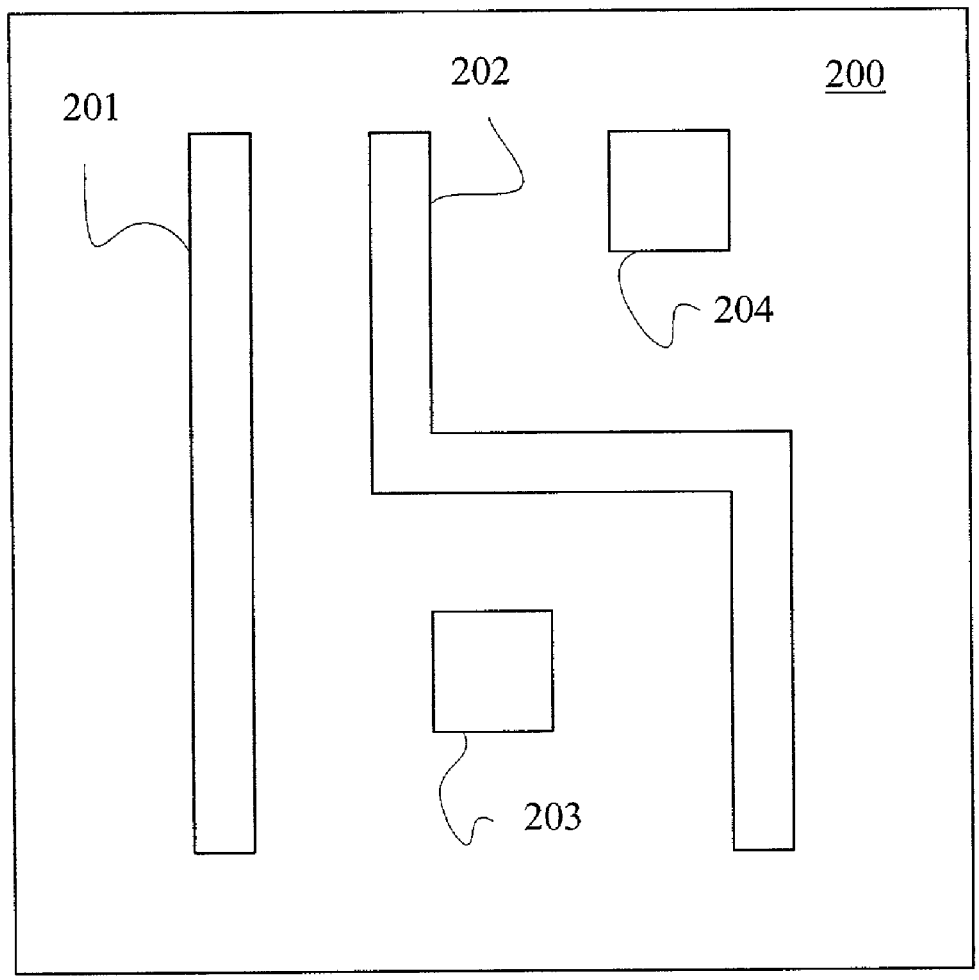
FIG. 2 illustrates an IC layer including two main features and two dummy pillars placed on regions of the wafer where geometry density is low.

In accordance with one feature of the invention, various automated techniques can be used to distinguish dummy features from main features. The difference between a dummy feature and a main feature can be set by one or more definitions. In one embodiment, a dummy feature can be defined as the complement of a main feature having predetermined characteristics. In another embodiment, a main feature can be defined as the complement of a dummy feature having predetermined characteristics. In yet another embodiment, both dummy and main features can have predetermined characteristics. A technique can apply at least one definition for identifying a dummy/main feature on a mask layer. The technique used can vary from one mask layer to another mask layer. As described in further detail below, the techniques can be advantageously used during any post-layout process for manufacturing a mask.

The detailed description will focus on the identification of dummy features primarily with reference to GDS-II formatted data files. However, embodiments of the invention can operate equally well with other data formats. This may be particularly necessary for embodiments of the invention that operate on fractured data files (e.g. data prepared for mask making fabrication equipment). For example, the CATS™ tool, licensed by the assignee of the invention, can read in a GDS-II format IC layout and fracture the data for mask fabrication. During the fracturing process, the CATS™ tool may modify the layout to, among other things, improve mask manufacturability. As such, during mask inspection and mask defect correction, the original GDS-II data file may not be available or if available may no longer be an accurate reference point. As such, embodiments of the invention can identify dummy features in a number of different data formats including fractured data formats, mask electron beam exposure systems (MEBES) formats, vendor-specific mask writing formats, vendor-specific mask inspection formats, and/or other appropriate data formats.

Discussion and reference to GDS-II formats are therefore exemplary only. Discussion of GDS-II specific features, e.g. multiple layers, should be understood as examples. Specifically, a single GDS-II file might contain information that is ultimately used to produce multiple masks. Therefore, in an embodiment of the invention working on MEBES data, the information about which layer the mask is to be used could be associated with the MEBES data, even though it is not stored in GDS-II format and is not directly a part of the MEBES format.

Identification Technique Using Multiple Layers

In one technique, combining information from multiple mask layers can quickly and accurately identify dummy/main features. This information can include connectivity information or functional association information. For example, a metal geometry in a design layout is typically used to connect two points. Specifically, each main feature in a metal layer connects to either a contact or a via to make an electrical connection to another feature in another layer. Thus, if a feature in a metal layer does not overlap at least one contact or via, then that feature is not carrying any electrical signal and, by definition, is not a main feature and can be identified as a dummy feature.

In the case of a mask for a first metal layer, the information from two mask layers can be compared: the first metal layer and a contact layer. As known by those skilled in the art, contacts can provide direct connection of first metal features with the active regions of a transistor. Thus, contacts can include first metal to p-diffusion and first metal to n-diffusion connections. Additionally, contacts can include first metal to polysilicon connections, as well as VDD and VSS substrate connections.

Figure 3A:
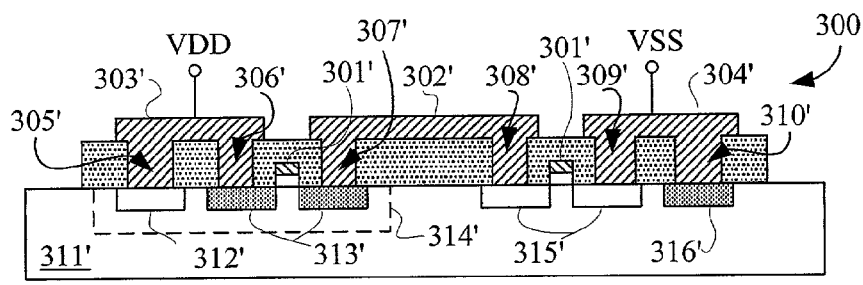
FIG. 3A illustrates a cross-sectional view of an inverter having first metal to p-diffusion, first metal to n-diffusion, VDD substrate, and VSS substrate contacts.

FIG. 3A illustrates a cross-sectional view of an inverter 300 having first metal to p-diffusion, first metal to n-diffusion, VDD substrate, and VSS substrate contacts. In inverter 300, the source/drain (p+) regions 313' of a p-type transistor are formed in an n-well 314', whereas the source/drain (n+) regions 315' of the n-type transistor are formed in a p-substrate 311'. A first metal feature 303' provides a VDD substrate connection to an n+diffusion area 312' via contact 305' as well as a first metal to p-diffusion (i.e. the source of the p-type transistor) connection via contact 306'. A first metal feature 304' provides a VSS substrate connection to a p+ diffusion area 316' via contact 310' as well as a first metal to n-diffusion (i.e. the source of the n-type transistor) connection via contact 309'. Finally, a first metal feature 302' provides a first metal to p-diffusion (i.e. the drain of the p-type transistor) connection via contact 307' as well as a first metal to n-diffusion (i.e. the drain of the n-type transistor) connection via contact 308'. Note that in inverter 300 the gates of the n-type transistor and the p-type transistor are coupled. Therefore, these gates are represented in FIG. 3A by one polysilicon feature 301'.

Figure 3B:
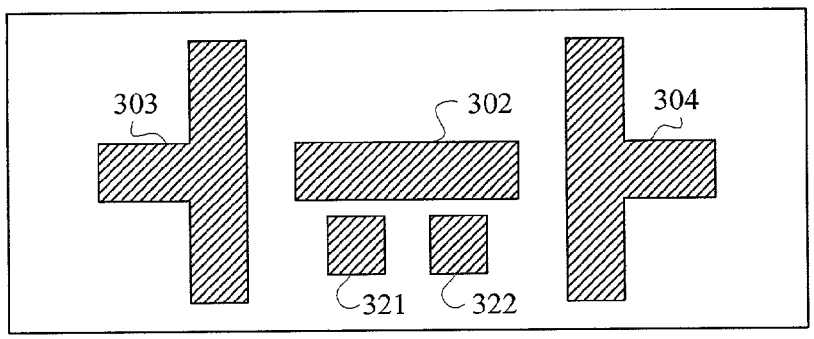
FIG. 3B illustrates a first metal layer for implementing the inverter of FIG. 3A.

After designing the first metal layer to implement inverter 300, dummy features can be placed on the first metal layer. In one embodiment, these dummy features can eliminate mechanical stress on the wafer during a CMP. For example, FIG. 3B illustrates a first metal layer for implementing inverter 300. The first metal layer includes a plurality of first metal features 302, 303, 304, 321, and 322 (wherein first metal features 302, 303, and 304 on the mask layer correspond to first metal features 302', 303', 304' of physical inverter 300).

Figure 3C:
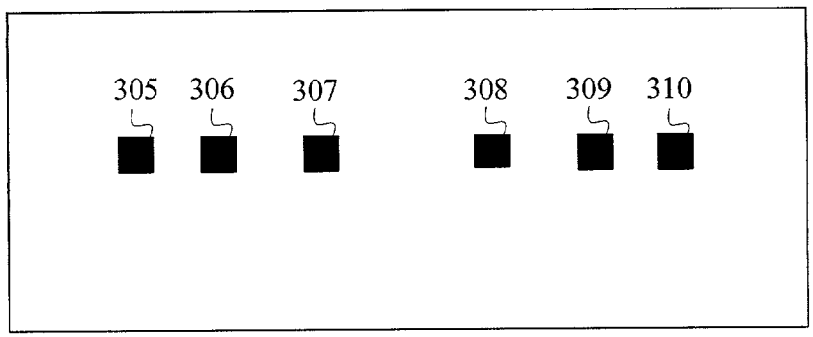
FIG. 3C illustrates a contact layer for implementing the inverter of FIG. 3A.
Figure 3D:
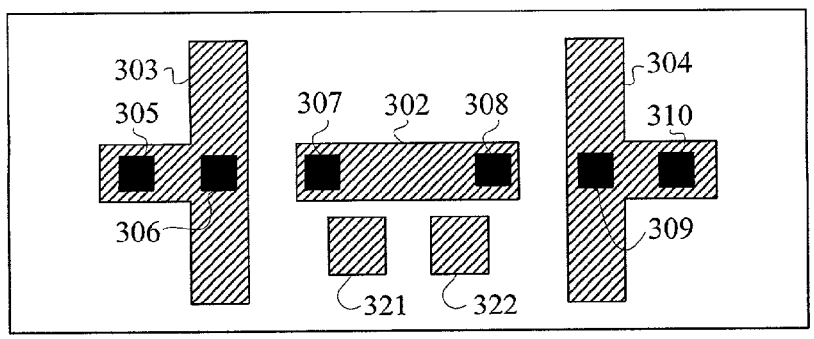
FIG. 3D illustrates a combined view of the first metal layer of FIG. 3B and the contact layer of FIG. 3C, thereby identifying certain first metal features as main features.

In one embodiment, the information from the first metal layer and from a contact layer can be combined to facilitate the identification of dummy/main features. FIG. 3C illustrates a contact layer for implementing inverter 300 including contacts 305–310. The combination of the information from these mask layers, shown in FIG. 3D, identifies the overlap of first metal structures with contacts. Specifically, any overlap indicates a main feature, whereas a lack of overlap indicates a dummy feature. As shown in FIG. 3D, first metal feature 302 overlaps contacts 307 and 308, first metal feature 303 overlaps contacts 305 and 306, and first metal feature 304 overlaps contacts 309 and 310. Therefore, first metal features 302, 303, and 304 are identified as main features. In contrast, metal features 321 and 322 have no overlap with any contacts. Therefore, in this technique, metal features 321 and 322 can be considered dummy features. Thus, the combination of the information from the first metal layer and the contact layer can identify main/dummy features on the first metal layer without requiring detailed knowledge of the exact functions of those features.

Figure 3E:
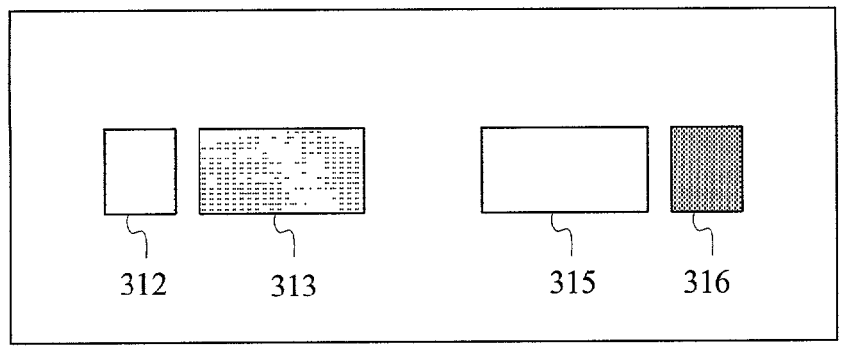
FIG. 3E illustrates a diffusion layer for implementing the inverter of FIG. 3A.

Information from other layers can also be used to identify main/dummy features on the first metal layer. For example, FIG. 3E illustrates a diffusion layer for inverter 300 including n+diffusion regions 312 and 315 as well as p+ diffusion areas 313 and 316. The diffusion regions in a substrate indicate active regions on the chip. Therefore, the overlap of first metal features with diffusion regions can also identify main features.

Figure 3F:
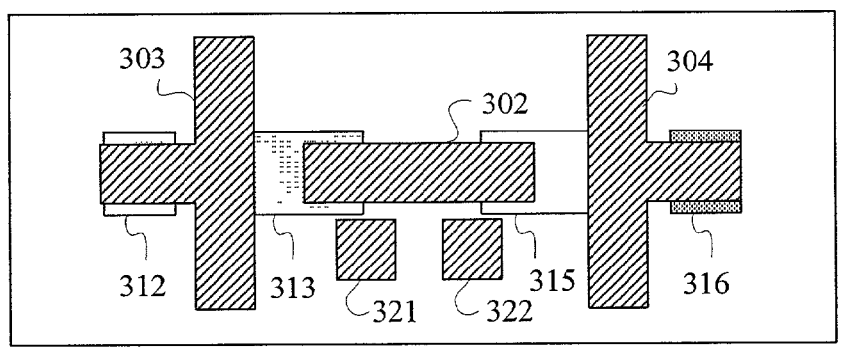
FIG. 3F illustrates a combined view of the first metal layer of FIG. 3B and the diffusion layer of FIG. 3E, thereby identifying certain first metal features as main features.

FIG. 3F illustrates the combination of the information from the first metal layer (FIG. 3B) and the diffusion layer (FIG. 3E). As shown in FIG. 3F, first metal feature 302 overlaps diffusion regions 313 and 315, first metal feature 303 overlaps diffusion regions 312 and 313, and first metal feature 304 overlaps diffusion regions 315 and 316, thereby indicating that first metal features 302, 303, and 304 are main features on the first metal layer. In contrast, first metal features 321 and 322 have no overlap with any diffusion regions. Therefore, first metal features 321 and 322 can be considered dummy features on the first metal layer. Thus, the combination of the information from the first metal layer and the diffusion layer can also identify main/dummy features on the first metal layer.

Figure 3G:
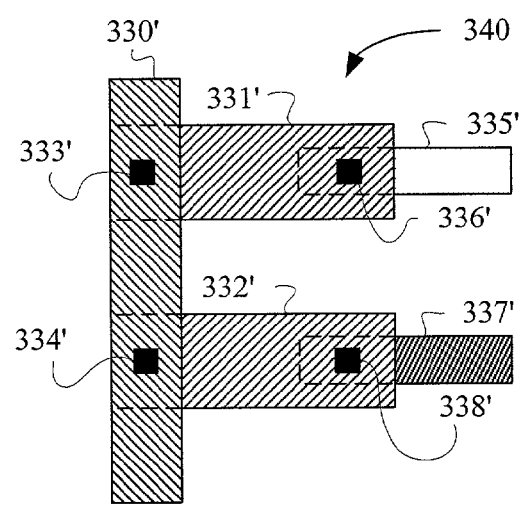
FIG. 3G illustrates one geometry including a second metal feature being connected to a plurality of first metal features using vias, wherein the first metal features are in turn connected to polysilicon and diffusion features using contacts.

In current CMOS chip design, a second, third, or fourth layer of metal can also be used. Connecting a second metal feature to a first metal feature can be done using a via. Similarly, connecting a third metal feature and a fourth metal feature to a second metal feature and a third metal feature, respectively, can also be done using vias. For example, FIG. 3G illustrates a geometry 340 including a second metal feature 330' being connected to first metal features 331' and 332' using vias 333' and 334', respectively. First metal features 331' and 332', in turn, can be connected to a diffusion area 335' and a polysilicon feature 337' using contacts 336' and 338', respectively.

Figure 3H:
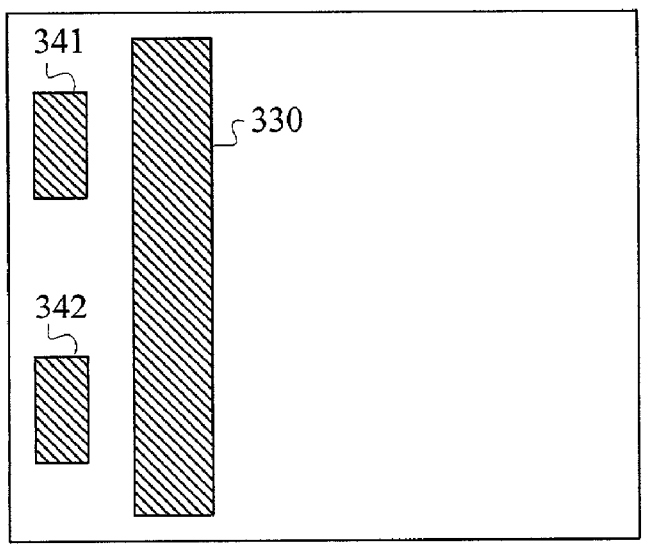
FIG. 3H illustrates a second metal layer for implementing the geometry of FIG. 3G.
Figure 3I:
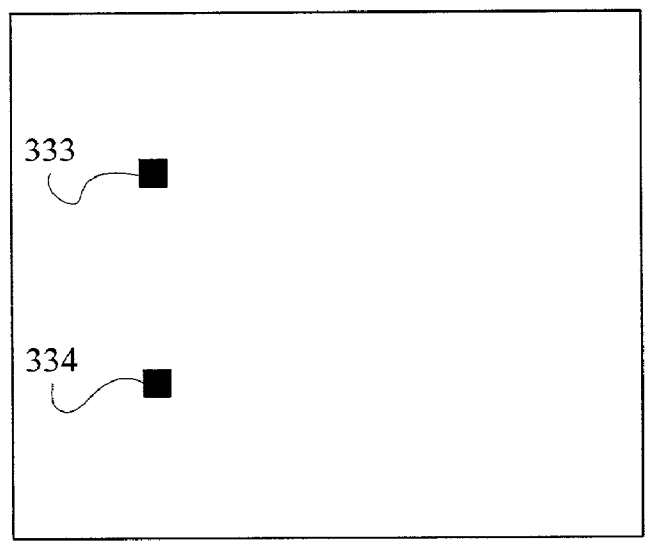
FIG. 3I illustrates a via layer for implementing the geometry of FIG. 3G.
Figure 3J:
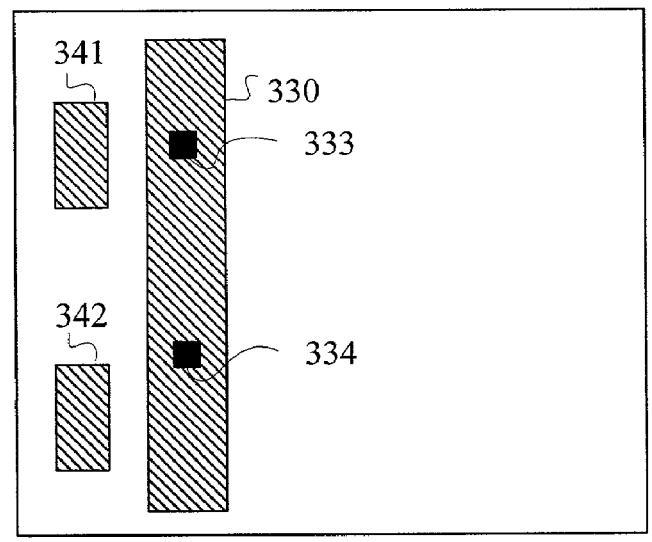
FIG. 3J illustrates a combined view of the second metal layer of FIG. 3H and the via layer of FIG. 3I, thereby identifying certain second metal features as main features.

A via layer, like a contact layer, can also identify main/dummy features on a metal layer. For example, FIG. 3H illustrates a second metal layer for implementing geometry 340, wherein the second metal layer includes a plurality of second metal features 330, 341, and 342. In one embodiment, the information from this second metal layer and from a via layer can be combined. FIG. 3I illustrates a via layer for implementing geometry 340 including vias 333 and 334. The combination of the information from these layers, shown in FIG. 3J, indicates the overlap of second metal structures with vias, wherein an overlap indicates a main feature and a lack of an overlap indicates a dummy feature. In this manner, second metal feature 330 can be identified as a main feature, whereas second metal features 341 and 342 can be identified as dummy features.

Figure 3K:
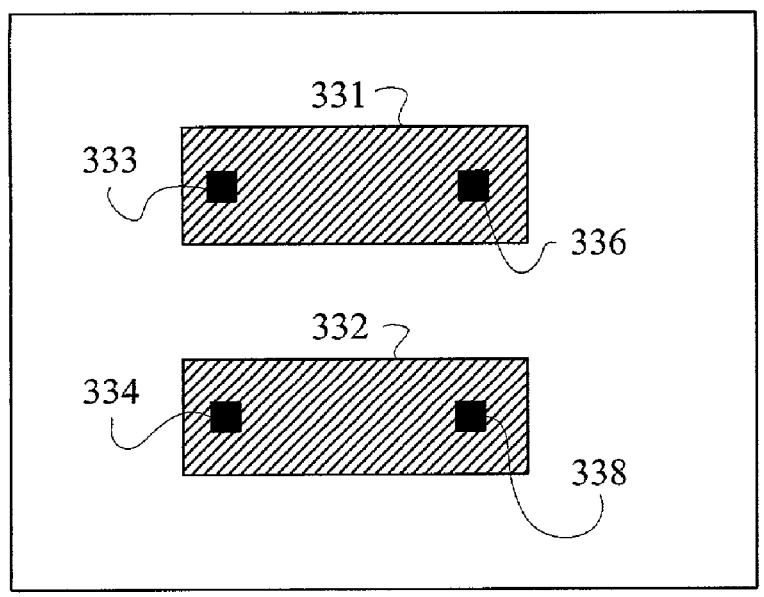
FIG. 3K illustrates a combined view of a first metal layer, a contact layer, and a via layer, thereby identifying certain first metal features as main features.

In another embodiment, information from three or more layers can be combined. For example, FIG. 3K illustrates a combined view of a first metal layer having features 331 and 332, a contact layer having contacts 336 and 338, and a via layer having vias 333 and 334. In this example, an overlap of a first metal feature with at least one of a contact and a via would identify the first metal feature as a main feature. In FIG. 3K, first metal feature 331 has an overlap with contact 334 and via 333, and first metal feature 332 has an overlap with contact 338 and via 334. Therefore, both first metal features 331 and 332 are identified as main features.

Note that the selection of the mask layers is dependent on a known connectivity or functional association of the main/dummy features on one mask layer to features on other mask layers. Thus, for example, if main features on a polysilicon layer are desired to be identified, then the information on the polysilicon layer can be combined with information from a diffusion layer (i.e. defining a functional association of a polysilicon gate to source/drain diffusion regions) as well as from a via layer (i.e. defining connectivity to second metal features, for example). In this manner, main features, e.g. polysilicon gates for transistors, can be distinguished from polysilicon that is merely used to improve the resolution of the printed polysilicon gates on a corresponding IC layer, also called "fake gates". In other words, the fake gates function as printable assist features. In another example, a test feature may have a connectivity and/or a functional association with a feature on another mask layer. However, additional information may be needed to determine whether the connectivity and/or functional association is "real". Therefore, in one embodiment of the technique, additional mask layers can be used to confirm a preliminary identification of a dummy/main feature.

Identification Technique Using Geometry

The geometry of one or more features on a mask layer can be used to identify a main/dummy feature in another technique. Geometric definitions can be based on, for example, feature size, feature shape, feature proximity, feature pattern, or a combination of any of the above.

In one embodiment, the size of the feature can distinguish a main feature from a dummy feature. For example, a main feature can be defined to have a width of 0.25 microns and a length of at least 2.0 microns. Thus, whatever feature meets this definition is identified as a main feature and, logically, whatever feature fails to meet this definition is identified as a dummy feature.

Figure 4A:
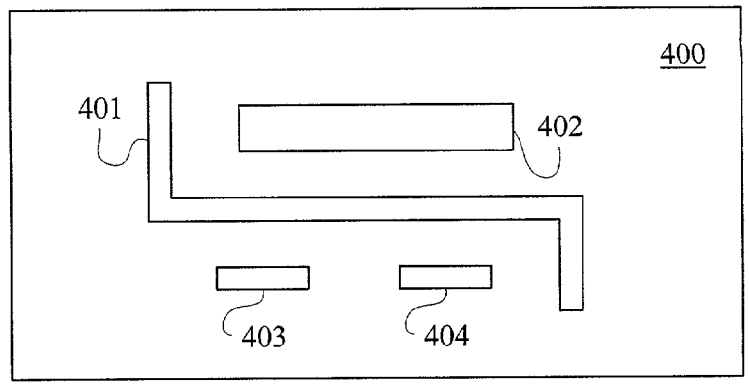
FIG. 4A illustrates a mask layer with various features, wherein a main feature has a predetermined width and a minimum length.

FIG. 4A illustrates a mask layer 400 including features 401, 402, 403, and 404. Assume that feature 401 meets the given definition of a main feature by having a width of 0.25 microns and a length of approximately 7.0 microns. Assume further that feature 402 has a width of 0.5 microns and a length of approximately 3.0 microns. In other words, although feature 402 meets the length requirement, feature 402 exceeds the width requirement. Therefore, feature 402 would be identified as a dummy feature. Assume that features 403 and 404 meet the width requirement of 0.25 microns, but are only 1.0 microns long and thus fail to meet the length requirement. Therefore, features 403 and 404 would also be identified as dummy features.

Figure 4B:
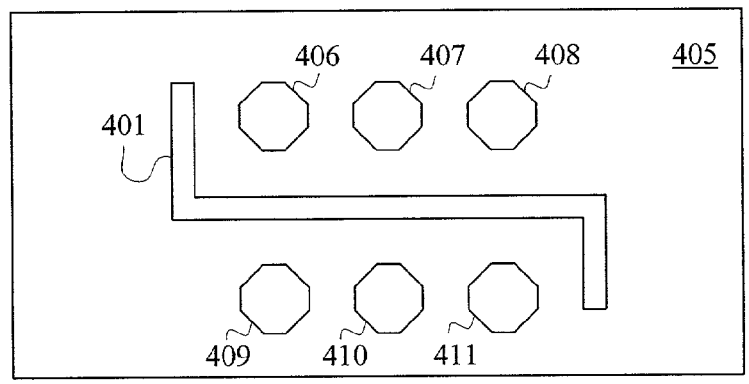
FIG. 4B illustrates a mask layer with various features, wherein a dummy feature has a predetermined shape.

In another embodiment, the shape of the feature can distinguish a main feature from a dummy feature. For example, a dummy feature can be defined to have a shape of a hexagon, i.e. a polygon of six angles and six sides. In one embodiment, if a feature has a shape other than a hexagon, then that feature is a main feature. FIG. 4B illustrates a mask layer 405 including features 401 and 406–411. In FIG. 4B, each of features 406–411 has a shape of a hexagon and therefore each is identified as a dummy feature. In contrast, feature 401 does not have a shape of a hexagon and therefore is identified as a main feature.

Note that the shape of a dummy feature is not limited to hexagons. For example, the shape of a dummy feature could be defined as a rectangle having a width of 0.25 microns and a length of 1.0 microns. Therefore, because features 403 and 404 (FIG. 4A) meet the shape definition, these features would be identified as dummy features. In another example, the shape of a dummy feature could be defined as any square having at least a predetermined size. In fact, the shape definition for a dummy feature can include any type of shape, wherein a shape can be defined by the number of angles/sides as well as measurements associated with those sides. Thus, a dummy feature could be defined as any type of polygon or even a more complex shape.

In yet another embodiment, the dummy features can form a pattern. For example, one defined dummy pattern could be features 406/407/408 or features 409/410/411. Other embodiments could provide multiple dummy patterns including various feature shapes and sizes. Thus, in another example, another dummy pattern could be features 403/404 (FIG. 4A). Moreover, in yet another example, a dummy pattern could be a combination of features 403 and 406. Thus, to define a dummy pattern, an edge of one feature having a first predetermined shape and/or size could be defined to be a fixed distance from another feature having a second predetermined shape and/or size. In some cases, the dummy pattern can be placed in some known relation with respect to features in an entirely different mask layer.

Figure 4C:
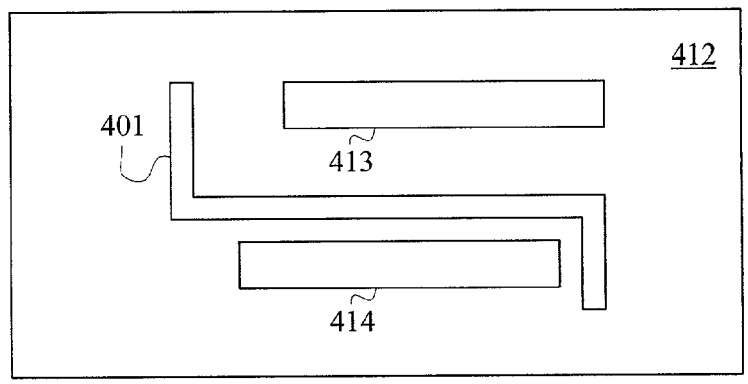
FIG. 4C illustrates a mask layer with various features, wherein a dummy feature can be defined as a feature having a minimum proximity to any neighboring feature.

In yet another embodiment, the proximity of one feature to a neighboring feature can distinguish a main feature from a dummy feature. A dummy feature can be defined as a feature positioned at least a predetermined distance from any neighboring feature. In one case, any feature positioned closer than the predetermined distance to a neighboring feature is then identified as a main feature. FIG. 4C illustrates a mask layer 412 including features 401 and 413–414. In this case, features 401 and 414 could be identified as main features, whereas feature 413 could be identified as a dummy feature.

In some embodiments, dummy features are identified as those features outside the optical proximity effect range of other features. For example, in FIG. 4C, feature 413 is outside of the optical proximity effect range of the other features, e.g. feature 401 and feature 414. In one variation of this embodiment, a halo the size of the optical proximity correction range is computed around each feature, wherein any feature whose halo does not intersect any other features and which is itself not intersected by any other feature's halo is considered a dummy feature.

Figure 5:
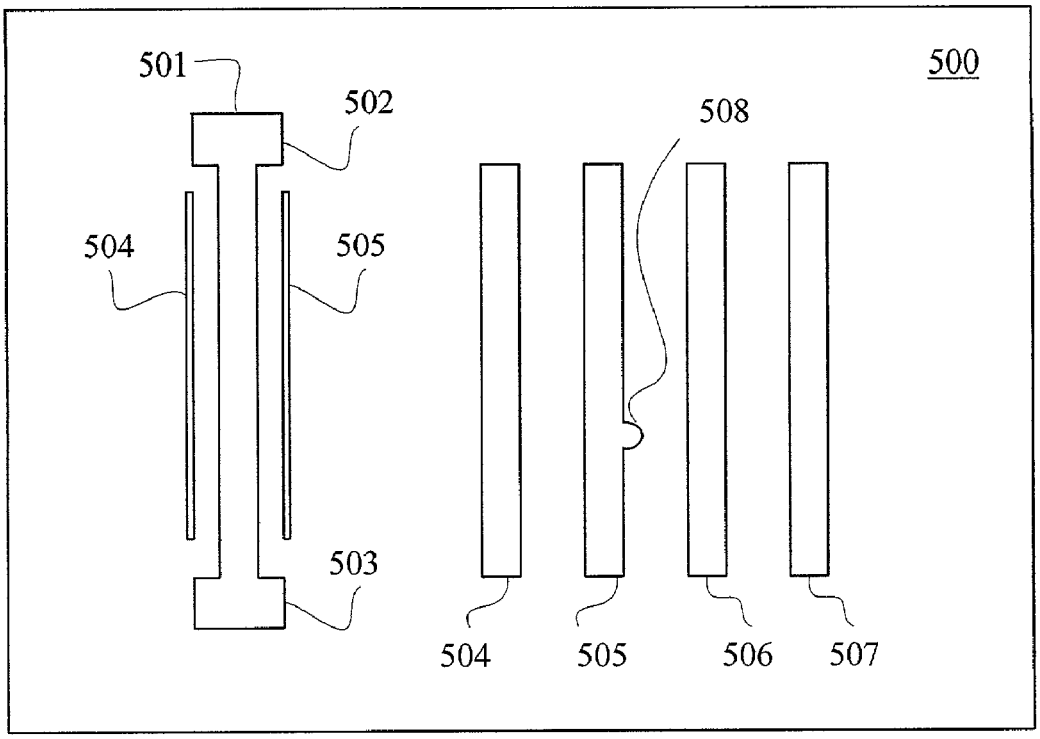
FIG. 5 illustrates a mask layer with an isolated main feature including optical proximity correction structures and a group of main features, wherein one feature in the group includes a defect.

Note that the use of multiple definitions, which can include different techniques, can produce more accurate identification results than using a single definition. For example, FIG. 5 illustrates a mask layer 500 including a feature 501. Note that feature 501 includes hammerheads 502 and 503, which are known optical proximity correction (OPC) structures. Assuming the size of the feature is one definition used to distinguish a main feature from a dummy feature (e.g. a main feature defined to have a width of 0.25 microns and a length of at least 2.0 microns) and the width of hammerheads 502/503 is greater than 0.25 microns, then feature 501 could be identified as a dummy feature. However, assuming the proximity of the feature to a neighboring feature (e.g. dummy features defined as features positioned at least a predetermined distance from any neighboring feature) is another definition used, then feature 501 could also be identified as a main feature because of its proximity to features 504 and 505.

Therefore, in a preferred embodiment, if one definition identifies the feature to be a dummy feature and another definition identifies the feature to be a main feature, then the feature is identified as a main feature. Note that using this conservative approach also results in features 504 and 505, which are also known OPC structures called assist bars, being identified as main features. This is a desirable result because assist bars have an extremely tight tolerance and therefore should be considered main features in any mask layer. In an alternative embodiment, OPC structures, such as hammerheads, serifs, and assist bars have separate identification definitions, which can be used after OPC correction has been done, thereby also improving the accuracy of main/dummy feature identification.

In accordance with one embodiment, using multiple definitions can also correct misidentifications due to defects. For example, mask layer 500 further includes features 504–507. However, feature 505 includes a defect 508. Once again, assuming the size of the feature is one definition used to distinguish a main feature from a dummy feature (e.g. a main feature defined to have a width of 0.25 microns and a length of at least 2.0 microns) and if the width of feature 505 with defect 508 is greater than 0.25 microns, then feature 505 could be mistaken for a dummy feature. However, assuming a feature pattern (e.g. where features 504–507 form a pattern) definition is also used, then feature 505 can be correctly identified as a main feature, thereby ensuring that the defect of feature 505 can be repaired during a mask defect correction process.

Figure 6:
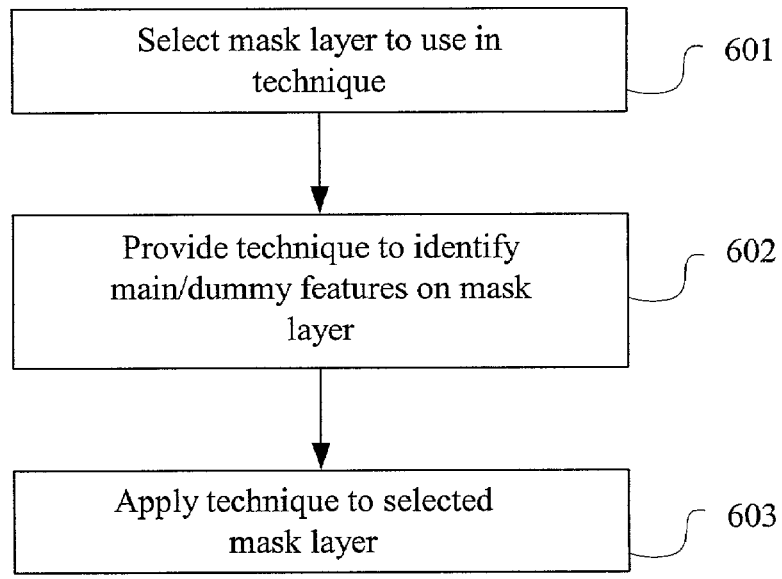
FIG. 6 illustrates a generic flowchart for using an identification technique in accordance with the invention.

FIG. 6 illustrates a generic flowchart for using an identification technique in accordance with the invention. In step 601, a mask layer can be selected. In step 602, the technique or combination of techniques used to identify the main/dummy features on the mask layer can be provided. Finally, in step 603, the technique can be applied to the selected mask layer.

Advantageously, using the identification techniques of the invention can significantly reduce the post-layout processing time associated with any mask operation. Moreover, by using the described multiple layer technique, geometrical technique, or combination thereof, any type of feature can be distinguished from another type of feature. For example, the definition for a main feature in a diffusion layer can be set to distinguish between the source/drain regions and the diffusion regions for VDD/VSS contacts. Thus, in accordance with one feature of the invention, the definition(s) set for a dummy/main feature can allow a one-level data file to function as a multi-level data file, thereby permitting the selective processing of features on that mask layer.

Figure 7:
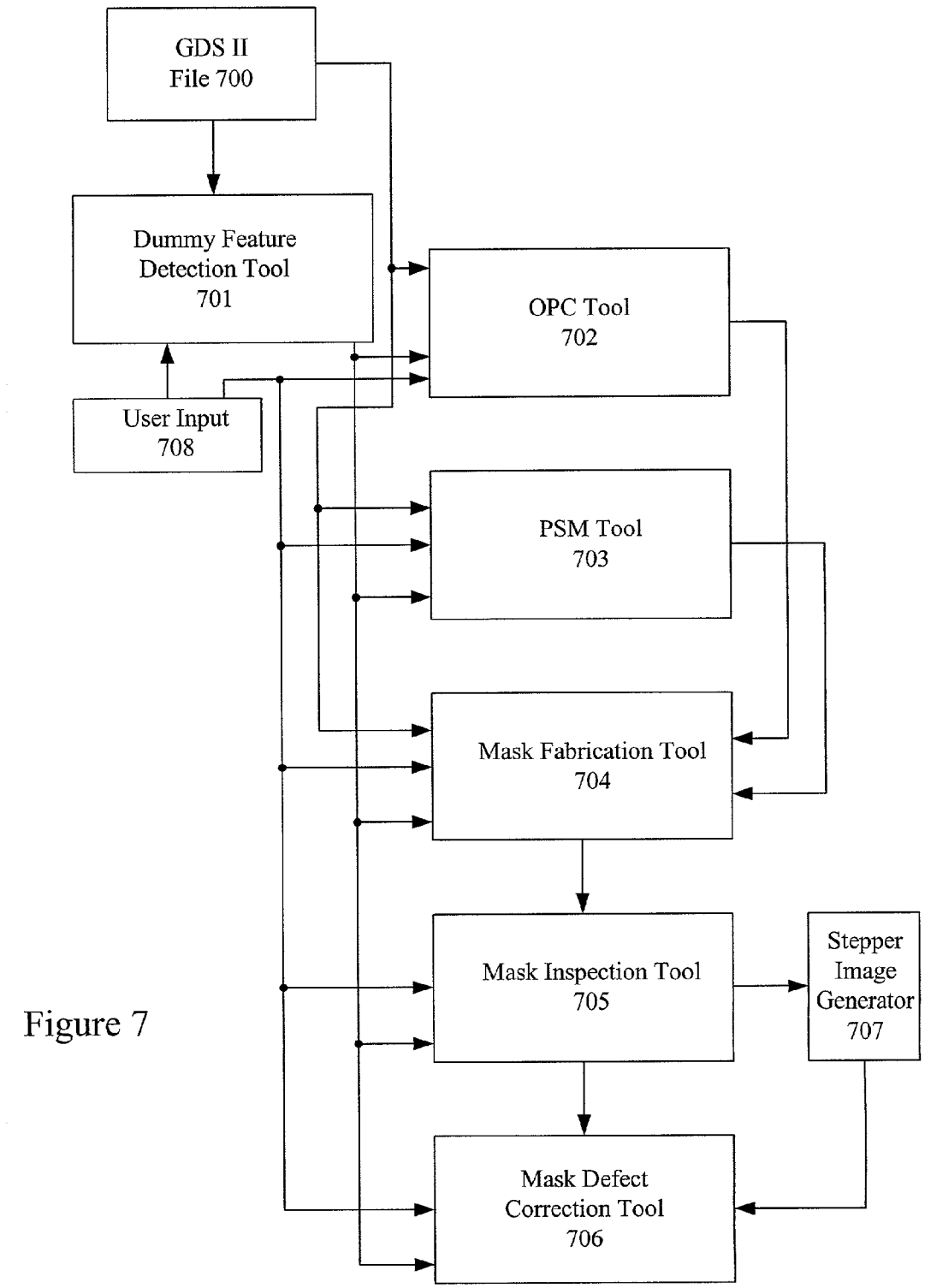
FIG. 7 illustrates a mask manufacturing system in accordance with one embodiment of the invention.

FIG. 7 illustrates a mask system in accordance with one embodiment of the invention. This system can include a dummy feature detection tool 701 that can interface with any one of an OPC tool 702, a PSM tool 703, a mask fabrication tool 704, a mask inspection tool 705, and a mask defect correction tool 706. Dummy feature detection tool 701, which can receive a GDS-II file as an input, typically includes a computer-implemented program that can be run on a variety of computer platforms including: a PC using the Windows 95™ or NT™ 4.0 operating system with 128 MB of RAM and a 200 MHz Pentium Pro™ microprocessor, either stand alone or connected to a network, and a SUN™ workstation computer among others.

In complicated and dense circuits in which the size of the features approach the optical limits of the lithography process, a mask can also include optical proximity correction (OPC) structures such as serifs, hammerheads, and assist bars. These OPC structures are designed to compensate for proximity effects on the mask. OPC tool 702 typically utilizes various process models, OPC rules, and techniques to incorporate OPC structures into a mask layout. In one embodiment, OPC tool 702 can receive dummy feature identification information from dummy feature detection tool 701, thereby limiting OPC to the main features of the mask layer. Optical proximity correction (OPC) tool 702 can include, for example, the iN-Tandem™ tool, the Photolynx™ tool, the SiVL™ tool, or the TROPiC™ tool licensed by the assignee of the invention. Applying OPC only to main features of the mask advantageously compensates for proximity effects on the mask while reducing the process time associated with this function.

Phase-shifting typically places 0- and 180-degree phase-shifting structures onto a mask to significantly reduce gate lengths. In one embodiment, PSM (phase-shifting mask) tool 703 can receive the dummy feature identification information from dummy feature detection tool 701 and use this information to automate the application of phase-shifting only to main features on the mask layer. PSM tool 703 can include the iN-Phase™ tool suite licensed by the assignee of the invention. To ensure maximum yield from a phase-shifted design, in one embodiment, PSM tool 703 can also apply OPC structures to any phase-shifted gate areas. Using the phase-shifted database, which can include the dummy feature identification information, and preset OPC process rules, PSM tool 703 can automatically apply corrective OPC structures only to the main features determined to be outside of silicon tolerance. Applying PSM structures only to main features of the mask ensures desirable feature size reduction while reducing the process time associated with this complex function.

Mask fabrication tool 705 transfers the final pattern on the mask layer onto the physical mask. Complex layouts are typically written onto a mask using an electron beam scanner. This scanner can use a raster scan or a vector scan. In the raster scan, the output of the scanner is moved in horizontal passes across portions of the mask and shifted an increment downwards after each pass. The spot size of the electron beam can be set small or large. In a vector scan, the electron beam is projected as various primitive shapes (such as rectangles and triangles) to form the desired feature.

In one embodiment, if a feature on a layout is identified as a main feature, then a raster scan with a small spot size can be used to write the feature onto the mask. On the other hand, if a feature on a layout is identified as a dummy feature, then a raster scan with a large spot size can be used to write the feature onto the mask. In this manner, the identification of main/dummy features significantly reduces fabrication time while preserving process controls, such as critical dimension (CD) control.

Mask inspection tool 705 includes an image acquirer, such as a scanning electron microscope (SEM), a focused ion beam microscope, an atomic force microscope, or a near-field optical microscope. The image acquirer can also include a CCD camera capable of interfacing with the particular type of microscope used and digitizing the image information from the microscope. The image data can be stored in a format such as Windows BMP on any type of appropriate media including a computer hard disk drive, a CDROM, or a server.

Mask inspection tool 705 can further include a defect detection processor that controls the manner in which the image acquirer scans the layer. The defect detection processor compares the scanned images to a set of potential defect criteria and determines which areas of the layer contain potential defects. In one embodiment, the defect detection processor includes a computer running a program of instructions and interfacing with the image acquirer such that scanning of the layer is performed in a predetermined manner. Dummy feature detection tool 701 can provide additional instructions to such a defect detection processor, thereby ensuring that valuable resources are not wasted inspecting dummy features for defects. However, the image data can still include both dummy features and main features, thereby facilitating a complete analysis for a simulated stepper image (described below). The defect detection processor can provide its output to a defect area image generator that generates images of the areas containing potential defects.

A stepper image generator 707 can use these images to create a simulated image of the wafer, and then check mask quality and analyze printability of the mask defects. In one embodiment, stepper image generator 707 can include an input device for reading stored data, an image processor for identifying the intensity transitions of the defect area image (for phase-shifting regions), and an image simulator to produce the simulated stepper image. Stepper image generator 707 can include, for example, the Virtual Stepper$^R$ System licensed by the assignee of the invention.

Mask defect correction tool 706 can provide any standard correction procedure, such as a laser procedure for removing chrome spots or pattern protrusions as well as a deposition procedure for selectively filling in missing chrome patterns. Mask defect correction tool 706 can receive dummy feature identification information from dummy feature detection tool 701, thereby limiting defect correction to main features and thus reducing the time to perform this process.

In a standard process flow, GDS-II file 700, which is mapped into a mask data preparation (MDP) language or format, can be provided to OPC tool 702, PSM tool 703, or mask fabrication tool 704. If the file is provided to one of OPC tool 702 or PSM tool 703, then the output from that tool would typically be provided to mask fabrication tool 704. The output of mask fabrication tool 704 would then be provided to mask inspection tool 705. Finally, the output of mask inspection tool 705 would be provided to mask defect correction tool 706. As previously noted, input 700 could also be in formats other than GDS-II.

Advantageously, because the dummy/main feature identification of the invention can be used for any post-layout process of the mask, each company performing a mask process can benefit from resource and cycle savings. For example, in accordance with one embodiment, a first company could perform the operations associated with OPC tool 702 and PSM tool 703, a second company could perform the operations associated with mask fabrication tool 704, a third company could perform the operations associated with mask inspection tool 705, and the second company could perform the operations associated with mask defect correction tool 706. Each of these companies could use the information from dummy feature detection tool 701 to achieve better process times. However, a company downstream would not be limited by an upstream company not using the information and vice versa. In this manner, the identification techniques described above provide maximum process flow flexibility while ensuring optimal times for each process. Logically, the more mask processes including the dummy/main feature identification of the invention, the greater the total resource and cycle savings.

In accordance with one embodiment, user input 708 can be provided to any system tool. User input 708 can include mask coordinates of dummy features identified or designated manually by the user. Thus, user input 708 can supplement or change the dummy identification information generated by dummy feature detection tool 701. User input 708 can also include selection information regarding the technique used to identify dummy features. In this case, user input 708 can be provided to dummy feature detection tool 701. In this manner, design-specific information known by the user can be factored into the automated process of the invention.

As appreciated from the above description, the invention can be applied to any post-layout process in the design, fabrication, inspection, and repair of a mask layer. The invention has been described in reference to various embodiments. These embodiments are illustrative only and not limiting. Those skilled in the art will recognize modifications to and variations of the invention. For example, the ability to identify dummy/main features can allow the use of smaller dummy features. Smaller dummy features could improve, for example, the CMP or the resolution of the main features on the integrated circuit layer and could allow for denser packing of features on the integrated circuit. Note that the invention is equally applicable to next generation lithography (NGL) equipment, which can include, for example, DUV, EUV, x-ray, and e-beam equipment. Further note that the invention can use any known physical relationship between features to identify the dummy/main feature. For example, the resistance between two nodes, the capacitance as determined by spacing and area of adjacent features, and the critical path as determined by measuring resistance and capacitance can also be used for identifying features. Additionally, although the invention has been described in reference to distinguishing between dummy and main features, the invention is equally applicable to defining multiple physical criteria or functional associations, wherein geometries of interest can be partitioned into two or more categories. For example, criteria can be defined that separate the geometry identification into Main Feature 1, Main Feature 2, . . . Main Feature N as well as Dummy Feature 1, Dummy Feature 2, . . . Dummy Feature N. Moreover, the invention can automatically distinguish between many types of features, including primary features, secondary features, etc. or, more generally, to feature type 1, feature type 2, etc. Therefore, the invention is limited only by the appended claims.

What is claimed is:

1. A method of distinguishing a dummy feature from a main feature, the method comprising:
   selecting a mask layer;
   providing a technique to identify the dummy feature on the mask layer generated with a one-level file; and
   applying the technique to the selected mask layer.

2. The method of claim 1, wherein the technique includes determining at least one of a size of a feature, a shape of a feature, a pattern from multiple features, and a proximity of a feature to another feature.

3. The method of claim 1, further including using information from at least one other mask layer to use in the technique.

4. The method of claim 3, wherein the information includes at least one of connectivity between the selected mask layer and the at least one other mask layer, and a functional association between the selected mask layer and the at least one other mask layer.

5. The method of claim 1, wherein the method is performed during at least one of optical proximity correction, placement of phase-shifting structures, mask fabrication, mask inspection, and mask repair.

6. An automated method of processing a mask layer for manufacturing an integrated circuit, the automated method comprising:
   identifying a plurality of main features and at least one dummy feature in the mask layer generated with a one-level file; and
   providing the processing only to the plurality of main features.

7. The method of claim 6, wherein processing includes at least one of correcting for optical proximity, providing phase-shifting structures, and using a user input regarding at least one of a main feature and a dummy feature.

8. The method of claim 6, wherein processing is performed during at least one of fabrication of a mask, inspection of a mask, and repair of a mask.

9. The method of claim 6, wherein identifying includes applying at least one of a multiple layer technique and a geometry technique.

10. The method of claim 6, wherein identifying includes determining a size of a feature on the mask layer, a shape of a feature on the mask layer, a pattern from multiple features on the mask layer, and a proximity of a feature to another feature on the mask layer.

11. The method of claim 6, wherein identifying includes using information from at least one other mask layer for the integrated circuit.

12. The method of claim 11, wherein the information includes at least one of connectivity between the mask layer and the at least one other mask layer, and a functional association between the mask layer and the at least one other mask layer.

13. A method of inspecting a mask for defects, the mask including a plurality of features, the method comprising:
   reading a mask data preparation format file, the mask data preparation file being a one-level file;
   identifying dummy versus non-dummy features using the mask data preparation format file; and
   inspecting only non-dummy features.

14. The method of claim 13, wherein identifying includes determining at least one of a size of a feature, a shape of a feature, a pattern from multiple features, and a proximity of a feature to another feature.

15. The method of claim 13, wherein identifying includes using information from at least one other mask.

16. The method of claim 15, wherein the information includes at least one of connectivity and a functional association between mask layers.

17. The method of claim 13, further including marking only the non-dummy features for repair.

18. A method of conserving resources in a computer system during optical proximity correction (OPC) of a layout of an integrated circuit (IC), the method comprising:
   identifying dummy versus non-dummy features from the layout, wherein dummy and non-dummy features are not separated in data representation; and
   expending resources for OPC only on non-dummy features.

19. The method of claim 18, wherein identifying includes determining at least one of a connectivity of features, a functional association of features, and a geometrical description of features.

* * * * *